United States Patent
Chen et al.

(10) Patent No.: US 6,812,167 B2
(45) Date of Patent: Nov. 2, 2004

(54) METHOD FOR IMPROVING ADHESION BETWEEN DIELECTRIC MATERIAL LAYERS

(75) Inventors: Yu-Huei Chen, Hsin-Chu (TW); Lain-Jong Li, Hsin-Chu (TW)

(73) Assignee: Taiwan Semiconductor Manufacturing Co., Ltd, Hsin Chu (TW)

(*) Notice: Subject to any disclaimer, the term of this patent is extended or adjusted under 35 U.S.C. 154(b) by 187 days.

(21) Appl. No.: 10/163,045

(22) Filed: Jun. 5, 2002

(65) Prior Publication Data

US 2003/0228769 A1 Dec. 11, 2003

(51) Int. Cl.[7] .............................................. H01L 21/00
(52) U.S. Cl. ...................... 438/931; 438/780; 427/491; 427/515
(58) Field of Search ................................. 438/770, 771, 438/780, 931; 427/465, 491, 505, 512, 515, 563, 249.1, 905

(56) References Cited

U.S. PATENT DOCUMENTS

| | | | | |
|---|---|---|---|---|
| 5,858,882 A | * | 1/1999 | Chang et al. | ................ 438/780 |
| 6,391,771 B1 | * | 5/2002 | Naik et al. | .................. 438/653 |
| 6,693,046 B2 | * | 2/2004 | Takigawa et al. | ........... 438/931 |

* cited by examiner

*Primary Examiner*—Kamand Cuneo
*Assistant Examiner*—Lisa Kilday
(74) *Attorney, Agent, or Firm*—Tung & Associates

(57) ABSTRACT

This invention provides a method to improve the adhesion between dielectric material layers at the interface thereof, during the manufacture of a semiconductor device. The first step is to form a SiC-based dielectric material layer over a substrate. The SiC-based dielectric material layer is treated by oxygen plasma. A second layer of dielectric material is formed over the SiC-based dielectric material layer.

13 Claims, 1 Drawing Sheet

METHOD FOR IMPROVING ADHESION BETWEEN DIELECTRIC MATERIAL LAYERS

FIELD OF THE INVENTION

This invention relates to processes for manufacturing monolithic integrated circuits which include overlaid layers of dielectric materials. More specifically, this invention relates to a method for improved the adhesion between low-K dielectric material layers.

BACKGROUND OF THE INVENTION

Dielectric material layers usually function to provide electric insulation between conductive layers and to protect underlying structures of the integrated circuit against contaminants (impurities, moisture) or impacts. The adjacency of dielectric material layers having the same or different compositions is a common occurrence in today's technology at several manufacturing stages of integrated circuits. In such processes, a second layer is subsequently formed over a first layer of dielectric material. That second layer may overlap the first at a next stage so as to completely cover it, as is the case with certain passivating steps, for example. However, before forming the second layer, other operations are often carried out (such as the formation of a sacrificial layer which is then etched away, either fully or partially, or such as the partial removal of the first layer itself without using a sacrificial layer). In any case, the second dielectric layer will have bottom surface portions in direct contact with top surface portions of the first.

The provision of successive layers ensures protection for the device even when any one of the layers becomes damaged, e.g., by the formation of fine cracks. Therefore it is important that no regions be allowed to have less than perfect adhesion between the overlaid layers in the areas of contact. Nonetheless, some materials develop peculiar adhesion problems at the interface which are not fully understood by those skilled in the art.

These problems already exist on account of certain inherent properties of the materials. In fact, when these are placed in layer form over another material, they develop by inherent stresses a more or less marked tendency to deform the underlying structure into a more or less curved shape, which may be concave or convex, according to whether the stress is a tensile or a compressive one. Where the adjacent underlying structure is also formed of another layer of dielectric material, the magnitude of the force acting on the two layers may vary even when the stress is of the same type and perhaps of equal value, due to fact that the thicknesses are generally different. At high values of that stress, the layers tend to separate and possibly "delaminate". In general, spontaneous de-lamination occurs where the stress at the interface exceeds the molecular adhesion forces acting between the two layers. This problem is aggravated by the application of external mechanical loads which add further stress, e.g., while dicing the wafer on which the circuit is formed. Other significant influences may include changes in temperature during the circuit manufacturing cycle, and environmental chemical attacks; these effects are apt to degrade the interlayer bonds.

The difficulty of achieving adhesion of the layers is further enhanced by certain methods which are commonly applied during the manufacture of an integrated circuit.

In order to improve adhesion between dielectric materials, some techniques have been developed which provide treatments of the surface of an underlying layer prior to forming the next.

One prior solution consists of bombarding the surface of a layer to be deposited with ions of an inert gas, such as argon or nitrogen, under plasma (sputtering process). In this way, the roughness of the surface is enhanced mechanically to provide increased gripping area for the reactants to be deposited, which improves adhesion. That technique applies to the instance of oxide layers deposited using tetraethylorthosilicate as the precursor (known as TEOS).

Another solution disclosed by U.S. Pat. No. 5,795,821, it is provides an oxide adhesive agent between two dielectric material layers. In this way, it provides improved adhesion. However, particularly with dielectric material layers having low k (dielectric constant <4), such as silicon carbide and SILK, they are ineffective to prevent separation of two successive layers.

SUMMARY OF THE INVENTION

It is an object of this invention to provide a method for improved the adhesion between dielectric material layers.

The other object of this invention is to provide a method to treat the surface of dielectric material layers with oxygen plasma to improve the adhesion thereof.

According to the above-mentioned objects, this invention provides a method to improve the adhesion between dielectric material layers at the interface thereof, during the manufacture of a semiconductor device. The first step is to form a first layer of dielectric material having a formula of $SiC_xN_y$, wherein $x \geq 0$ $y \geq 0$ and $x+y \neq 0$. The oxygen ions are supplied into the first layer of dielectric material. A second layer of dielectric material is formed over the first layer of dielectric material.

The first layer of dielectric material used in this invention is selected from the group consisting of silicon carbide, silicon nitride and the mixture thereof. Preferably, this first layer is SiC-based dielectric material layer. The second layer is silicon based dielectric material, such as siloxane polymer low K film. Preferably, the second layer is LKD, which is an inorganic siloxane polymeric film.

Preferably, the step of supplying oxygen ion to the first layer of dielectric material is performed by oxygen plasma treatment.

The object of this invention also can be achieved by the steps as follows. A first layer of SiC-based dielectric material is formed on a substrate. The first layer of SiC-based dielectric material is treated by oxygen plasma. A second layer of silicon-based dielectric material is formed over the first layer of SiC-based dielectric material. A third layer of dielectric material, such as LKD, is formed over the second layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Embodiment 1

Figure 1A:
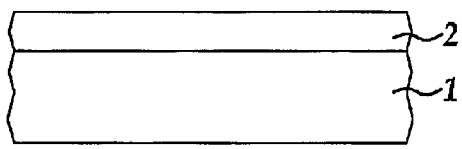
FIGS. 1A, 1B and 1C are cross-sectional views of a preferred embodiment in accordance with the present invention.
Figure 1B:
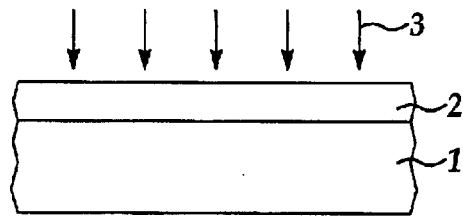
Figure 1C:
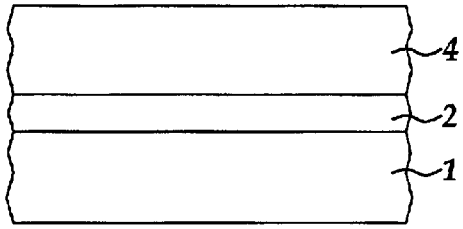

FIGS. 1A, 1B and 1C illustrate a preferred embodiment of the present method for improving adhesion between dielectric material layers at the interface thereof. Referring to FIG. 1A, a first dielectric material layer 2, such as SiC-based material, is usually formed over a substrate 1 by chemical vapor deposition technique. The thickness of the first dielectric material layer 2 is from 50 to 3000 Å. The chemical precursors used during CVD are tetramethylsilane, optionally together with $NH_3$ and $N_2$. Optionally, the tetramethol-silane can be replaced with trimethylsilane, dimethylsilane and methylsilane. The temperature of the deposition is achieved at the range of 200° C. to 450° C.

The first dielectric material layer 2 then is treated with oxygen plasma 3, as shown in FIG. 1B. The oxygen plasma treatment is performed at the gas flow of 50–500 sccm, the power of 50–300 W and the treatment times of 5–30 seconds. Preferably, the oxygen plasma treatment is at a temperature of 300° C. and the treating time is 10–20 seconds. The oxygen plasma treatment is performed at a chemical vapor deposition chamber which is the same as that of the deposition of the first dielectric material layer 2. Alternatively, The oxygen plasma treatment can be performed at a CVD chamber other than that of the first dielectric material layer 2.

Referring to FIG. 1C, a second dielectric material layer 4 with a thickness of 50–10000 Å is deposited over the first dielectric material layer 2. The second dielectric material layer 4 is silicon based dielectric material, such as siloxane. Preferably, the second layer 4 is FLARE.

Embodiment 2

Figure 2:
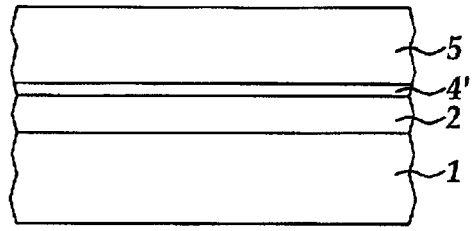
FIG. 2 is another embodiment in accordance with the present invention.

Referring to FIG. 2, the material of the first dielectric material layer 1 and the condition of the oxygen plasma treatment process used are the same as that of embodiment 1. After the oxygen plasma treatment, a second dielectric material layer 4' with a be thickness of 50 to 300 Å A is coated over the first dielectric material layer 2. Then, a low-k (dielectric constant <3.8) layer 5 with a thickness of 50 to 7000 Å is applied over the second dielectric material layer 4'.

The use of the second dielectric material layer 4' is to further improve the adhesion between the first dielectric material layer 2 and the low-K layer 5. In this embodiment, the second dielectric material layer 4' used is AP4000, a trademark provided by the Dow Chemical Company. The low-k layer 5 used is SILK.

Figure 3:
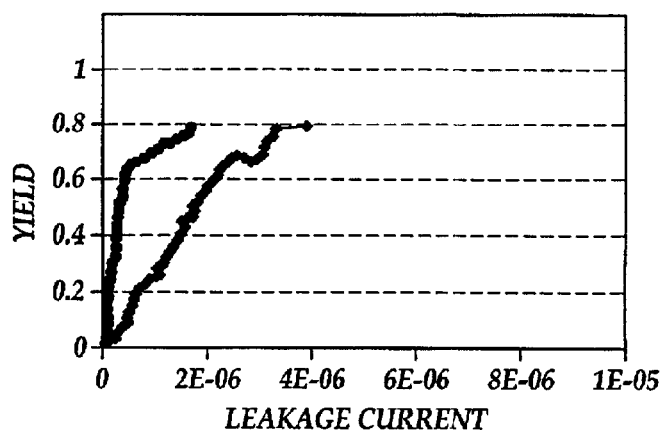
FIG. 3 is a comparison of the leakage currents between the final product of the present invention and that of the prior art.

FIG. 3 is a comparison of the leakage currents between the product made by Embodiment 2 and a prior product. The prior product is made by the same process and used the same material as that of Embodiment 2, except that the first dielectric material layer of the prior product does not treat by oxygen plasma. Curve 6 is a testing result of a prior product. Curve 7 is the testing result of the product of Embodiment 2. The leakage current of curve 7 is lower than that of curve 6.

While the preferred embodiment of the invention has been illustrated and described, it will be appreciated that various changes can be made therein without departing from the spirit and scope of the invention.

What is claimed is:

1. A method for improved adhesion between dielectric material layers at the interface thereof, during the manufacture of a semiconductor device, comprising the steps of:

forming a first layer of dielectric material having a formula of $SiC_xN_y$ wherein $x \geq 0$, $y \geq 0$ and $x+y \neq 0$;

supplying oxygen ions to said first layer of dielectric material; and forming a second layer of dielectric material over said first layer of dielectric material.

2. A method according to claim 1, wherein said first layer of dielectric material is selected from the group consisting of SiC, SiN and the mixture thereof.

3. A method according to claim 1, wherein said first layer of dielectric material is formed using a chemical vapor deposition technique.

4. A method according to claim 1, wherein the step of supplying oxygen ions to said first layer of dielectric material is performed by oxygen plasma treatment.

5. A method according to claim 4, wherein said oxygen plasma treatment is performed by the gas flow of 50–500 sccm, the power at 50–300 W and the treatment times of 5–30 sec.

6. A method according to claim 5, wherein said oxygen plasma treatment is performed at a chemical vapor deposition apparatus.

7. A method according to claim 1, wherein said second layer includes silicon based dielectric material.

8. A method according to claim 7, wherein said silicon based dielectric material is siloxane.

9. A method according to claim 7, wherein said silicon based dielectric material is polyaryl ether.

10. A method for improved adhesion between dielectric material layers at the interface thereof, during the manufacture of a semiconductor device, comprising the steps of:

forming a first layer of Sic-based dielectric material;

treating said first layer of SiC-based dielectric material by oxygen plasma; and forming a second layer of silicon-based dielectric material over said first layer.

11. A method according to claim 10, wherein said first layer is formed using a chemical vapor deposition technique.

12. A method according to claim 10, wherein said oxygen plasma treatment is performed by the gas flow of 50–500 sccm, the power at 50–300 W and the treatment times of 5–30 sec.

13. A method according to claim 10, wherein said oxygen plasma treatment is performed at a chemical vapor deposition apparatus.

* * * * *